United States Patent
Rupp et al.

(12)

(10) Patent No.: US 6,172,390 B1
(45) Date of Patent: Jan. 9, 2001

(54) SEMICONDUCTOR DEVICE WITH VERTICAL TRANSISTOR AND BURIED WORD LINE

(75) Inventors: Thomas S. Rupp, Stormville; Johann Alsmeier, Wappingers Falls, both of NY (US)

(73) Assignee: Siemens Aktiengesellschaft, Munich (DE)

(*) Notice: Under 35 U.S.C. 154(b), the term of this patent shall be extended for 0 days.

(21) Appl. No.: 09/047,581

(22) Filed: Mar. 25, 1998

(51) Int. Cl.⁷ ................................................ H01L 21/8242
(52) U.S. Cl. .......................... 257/302; 257/296; 438/244
(58) Field of Search .................... 257/329, 71, 311, 257/588, 296, 301, 906, 908, 304, 305, 302; 438/242, 243, 427

(56) References Cited

U.S. PATENT DOCUMENTS

| | | | |
|---|---|---|---|
| 4,824,793 | 4/1989 | Richardson et al. | 437/47 |
| 4,833,516 | 5/1989 | Hwang et al. | 357/23.6 |
| 4,949,138 * | 8/1990 | Nishimura | 257/296 |
| 4,967,247 * | 10/1990 | Kaga et al. | 257/311 |
| 5,102,817 | 4/1992 | Chatterjee et al. | 437/47 |
| 5,103,276 | 4/1992 | Shen et al. | 357/23.6 |
| 5,164,917 | 11/1992 | Shichijo | 365/149 |
| 5,177,576 * | 1/1993 | Kimura et al. | 257/71 |
| 5,208,657 | 5/1993 | Chatterjee et al. | 257/302 |
| 5,225,697 | 7/1993 | Malhi et al. | 257/302 |
| 5,227,660 * | 7/1993 | Horiuchi et al. | 257/588 |
| 5,252,845 | 10/1993 | Kim et al. | 257/302 |
| 5,281,837 * | 1/1994 | Kohyama | 257/296 |
| 5,291,438 | 3/1994 | Witek et al. | 365/149 |
| 5,460,994 | 10/1995 | Kim | 437/52 |
| 5,578,850 | 11/1996 | Fitch et al. | 257/329 |
| 5,817,552 | 10/1998 | Roesner et al. | 438/241 |
| 5,885,864 | 3/1999 | Ma | 438/253 |
| 5,907,170 | 5/1999 | Forbes et al. | 257/296 |
| 5,909,618 | 6/1999 | Forbes et al. | 438/242 |
| 5,929,477 | 7/1999 | McAllister Burns, Jr. et al. | 257/306 |
| 5,949,700 | 9/1999 | Furukawa et al. | 365/51 |

* cited by examiner

Primary Examiner—Matthew Smith
Assistant Examiner—Calvin Lee
(74) Attorney, Agent, or Firm—Standton Braden (57) ABSTRACT

A word line is buried beside a vertical semiconductor device. The word line is embedded adjacent to the vertical semiconductor device such that the topography of the word line is substantially planar. The planar features of the buried word line allows further processing to performed over the word line and the vertical transistor. In another embodiment, the vertical semiconductor device is a transistor having a vertically oriented gate. The word line is buried beside the vertically oriented gate, such that the topography of the word line is substantially planar.

15 Claims, 13 Drawing Sheets

SEMICONDUCTOR DEVICE WITH VERTICAL TRANSISTOR AND BURIED WORD LINE

BACKGROUND OF THE INVENTION

The present invention relates to semiconductor devices, and more particularly to semiconductor devices utilizing vertical transistors.

The semiconductor industry is constantly trying to decrease the size of semiconductor devices. The need for miniaturization is needed in order to accommodate the increasing density of circuits necessary for today's semiconductor products. It is not uncommon for a single semiconductor product to include, for example, over a million semiconductor devices.

Typically, the focus of miniaturization has been placed on the two-dimensional horizontal plane of a semiconductor device. Device sizes have approached sizes down to 0.2 microns and less. However, the decrease in the horizontal dimensions of semiconductor devices have created problems in the operational characteristics of the semiconductor devices.

Figure 1:
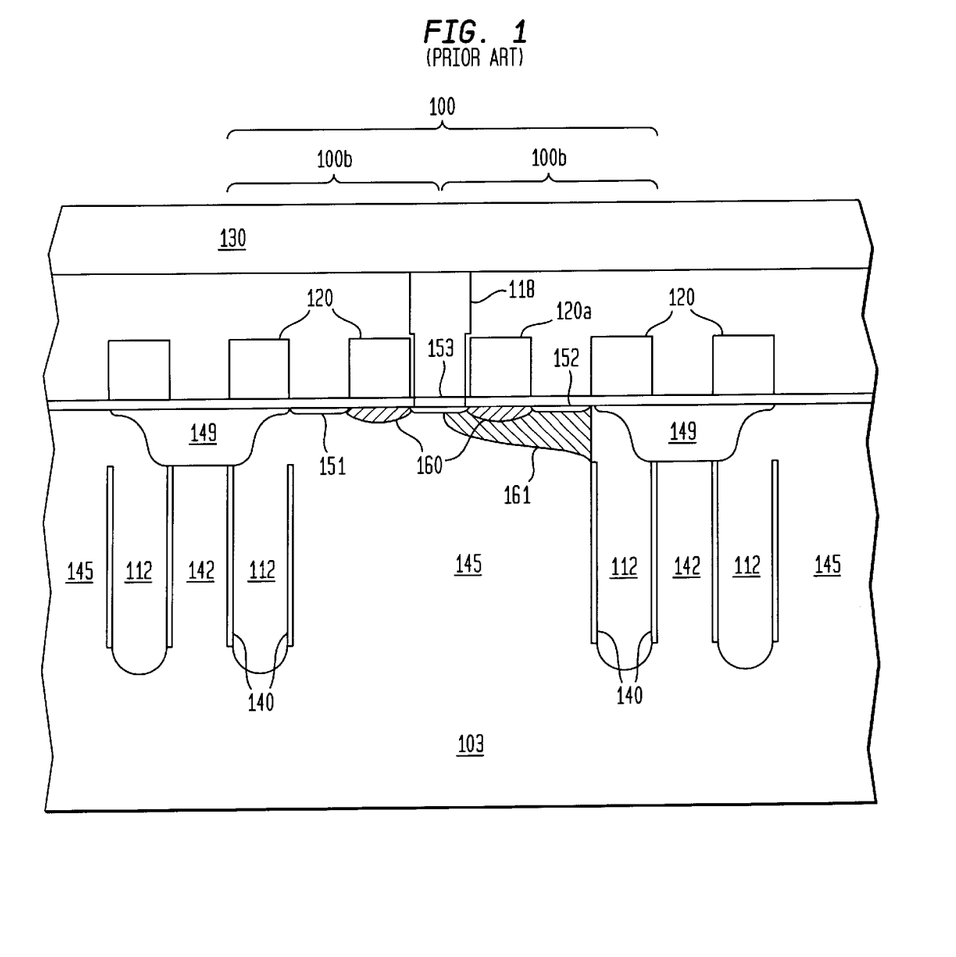
FIG. 1 is a cross-sectional view of a prior art semiconductor device.

FIG. 1 is a cross-sectional view of a prior art semiconductor device, representing, for example, a dynamic random access memory (DRAM) device. Referring to FIG. 1, semiconductor device 100 is typically comprised of several layers. The semiconductor device begins with a silicon substrate 103 upon which the other elements of the semiconductor device are built. In the illustrated example of a prior art semiconductor device, semiconductor device 100 is a dual device containing two separate semiconductor devices 100a and 100b.

Within the substrate, deep trenches 112 are created with polysilicon. Surrounding the deep trenches are dielectric layers 140. Dielectric layers 140 are typically comprised of a thick dielectric to insulate deep trenches 112. Additionally, the deep trenches of separate devices are isolated by silicon barriers 142 that are typically extensions of substrate 103. Between deep trenches 112 is an active area 145. Active area 145 is primarily composed of silicon.

Above silicon barriers 142 are shallow trench isolation layers 149. Shallow trench isolation layers 149 are typically composed of a thin dielectric. The shallow trench layers typically provide further isolation between two adjacent semiconductor devices 100.

Within active area 145 doped regions 151, 152 and 153 are typically formed to create the active components of the semiconductor device. Doped regions 151, 152 and 153 may be doped n or p type depending upon the type of device desired.

Connected to doped region 153 is a bit line contact 118 that electrically couples doped region 153 to bit line 130. Immediately above doped regions 151 and 152 is an oxide layer 156 that isolates doped regions 151 and 152. Adjacent to doped regions 151 and 152, and above oxide layer 156, are word lines 120. A depletion region 160 is created in active area 145 between doped regions 152 and 153 by properly biasing word line 120a with respect to substrate 103 and bit line 130. When word line 120a is further biased, an inversion region 161 is created within active area 145. Inversion layer 161 allows a current to flow between doped region 153 and deep trench 112. The direction of the current depends upon the bias of bit line 130 with respect to substrate 103.

Typically, current flows between bit line 130 and deep trench 112 through bit line contact 118, doped region 153 and inversion region 161 to deep trench 112. Depending upon the bias of bit line 130 charge can be stored within deep trench 112 or discharged from deep trench 112. Dielectric layers 140 act as insulators to preserve the charge stored in deep trench 112.

Thus, word lines 120 act as a gate for semiconductor devices 100a and 100b. Bit line 130 is the drain or source, depending upon the biasing of the device; and deep trench 112 is the source or drain.

Figure 2:
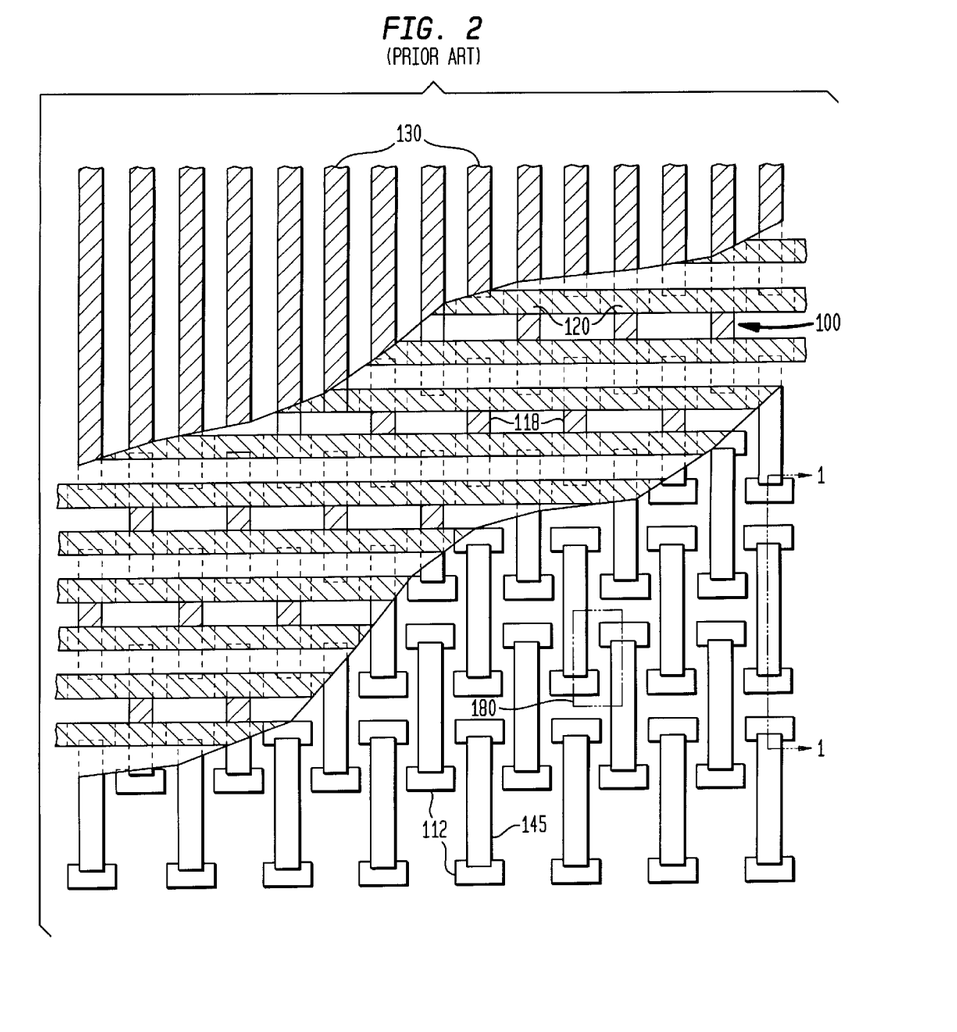
FIG. 2 is a top perspective view of several prior art semiconductor devices 100 of FIG. 1.

FIG. 2 is a top perspective view of several prior art semiconductor devices 100 of FIG. 1. The cross-sectional view of FIG. 1 is taken along lines 1—1. The different layers of the semiconductor devices are depicted in FIG. 2. The size of a single device (e.g., 100a or 100b) is measured by device area 180. The size of prior art semiconductor devices typically approach $8F^2$, where F is the minimum device size, or dimension capable by the fabrication process (e.g., 0.2 microns). Even with further miniaturization in the horizontal plane smaller device areas are difficult to achieve.

The smaller the device area of a semiconductor device, more problems develop in the operation of the semiconductor device. For example, hot carriers and punch through problems occur in devices of small dimensions resulting, e.g., in a degraded gate oxide which typically destroys the semiconductor device.

Due to these types of problems, the small planar scale semiconductor devices must be operated in exacting conditions. Thus, more circuitry is required to operate the devices.

Further, small errors in fabrication of the small scale planar semiconductor devices have greater detrimental effects on the semiconductor devices. For example, if word line 120, which is the gate, is located too close or over the deep trench 112, the device would not operate properly due to leakage currents.

Figure 3:
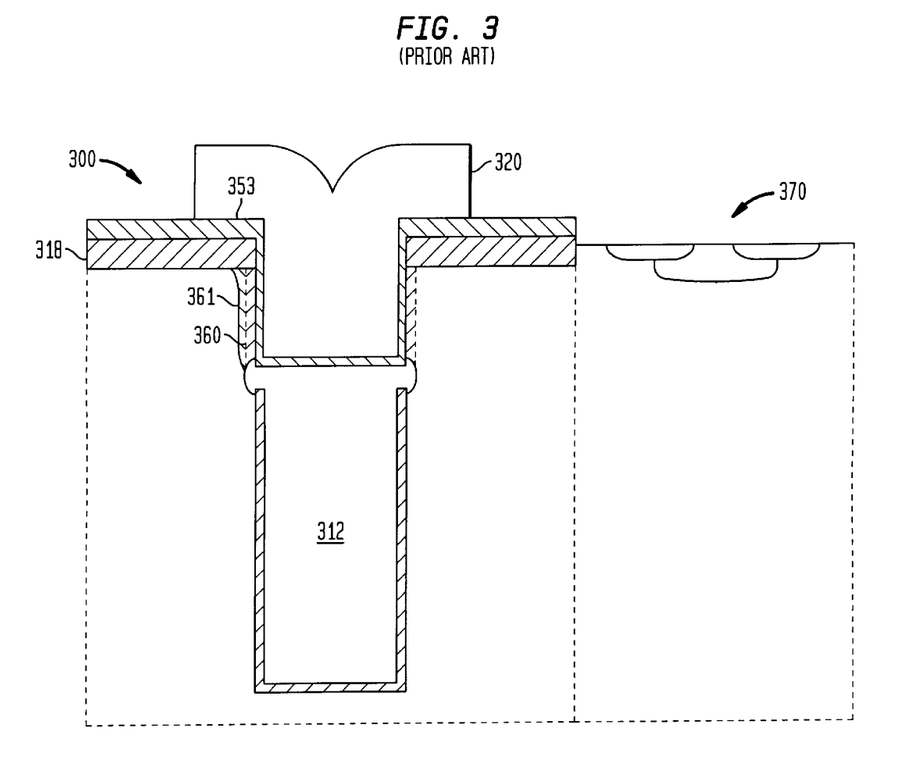
FIG. 3 depicts a prior art vertical transistor device 300.

One method of trying to miniaturize semiconductor devices without having to significantly reduce the actual size of the device is to create vertical devices. FIG. 3 depicts a prior art vertical transistor device 300. The vertical transistor 300 minimizes the device area while at the same time allowing the semiconductor size to be of a manageable size for purposes of operation. Vertical semiconductor device 300 operates similar to planar semiconductor device 100.

Vertical semiconductor device 300 includes a bit line contact 318, a doped region 353, a word line 320 and a deep trench 312. Bit line contact 8 is coupled to a bit line (not shown). Word line 320 acts as a gate, and creates a depletion region 360 when properly biased. When word line 320 is further biased to create an inversion region 361 a current flows from the bit line through bit line contact 318 to deep trench 312, or vice versa.

While prior art vertical semiconductor devices provide small area sizes and device sizes that are not detrimentally small, prior art vertical semiconductor devices prevent further fabrication of devices over the vertical semiconductor devices due to their topography. For example, in FIG. 3, the topography of the device above deep trench 312 is irregular due to the irregular formation of word line 320. Thus, further layers placed over the irregular topography typically form irregularly. In CMOS processing further fabrication of devices requires a substrate layer free of topographical irregularities. Thus, in CMOS processes, further fabrication is hampered over the prior art semiconductor device due to the irregular topography.

Additionally, logic circuits are typically formed on a circuit region 370 on the same substrate as the prior art vertical semiconductor device. Typically, the vertical device, in this case a dynamic random access memory (DRAM) device, is formed first on the substrate. In further steps circuit region 370 is formed. The separate processing steps causes differences in elevation between the prior art vertical semiconductor device and circuit region 370. Word line 320 is significantly offset from any subsequent word lines formed on circuit region 370. Also, due to the irregular topographies of word lines 320 of prior art vertical semiconductor device 300 the circuit region 370 are at a different elevation than any subsequent logic circuits that may be applied over the prior art vertical semiconductor device. Thus, intercoupling of the logic circuits formed on circuit region 370 and subsequent logic circuits that may be formed over prior art vertical semiconductor device 300 is further hampered because of the elevational differences.

In view of the foregoing, there are desired improved methods and apparatus for overcoming the disadvantages associated with prior art semiconductor devices. More particularly, a semiconductor device that minimizes device area sizes, while not overly minimizing device sizes and not limiting further device fabrication and methods for making same is desired.

SUMMARY OF THE INVENTION

To achieve the foregoing and other objects and in accordance with the purpose of the present invention, a vertical semiconductor device having a buried word line is disclosed.

In one embodiment, a word line is buried beside a vertical semiconductor device. The word line is embedded adjacent to the vertical semiconductor device such that the topography of the word line is substantially planar. The planar features of the buried word line allows further processing to performed over the word line and the vertical transistor.

In another embodiment, the vertical semiconductor device is a transistor having a vertically oriented gate. The word line is buried beside the vertically oriented gate, such that the topography of the word line is substantially planar.

In a further embodiment, the topography of a top surface of the word line is planarized. Planarization is possible without detrimentally damaging the semiconductor device due to the buried nature of the word line.

Yet another embodiment of the present invention is a method for forming a buried a word line wherein the word line is formed over a deep trench and adjacent to a gate layer. The topography of a top surface of the buried word line is substantially planar, such that a subsequent layer formed over the word line is substantially planar. Thus, further processing may be performed on the subsequent layer. In a further embodiment the top surface of the buried word line is planarized such that the semiconductor device is not detrimentally harmed. A subsequent layer is formed over the buried word line, in another embodiment, wherein the forming of the subsequent layer is possible due to the substantially planar topography of a top surface of the dynamic random access memory cell device. The subsequent layer formed over the buried word line may be planarized, in a further embodiment, such that further processing may be performed on the subsequent layer.

A buried word line, in conjunction with a vertical semiconductor device, provides smaller device areas. At the same time, the actual size of the semiconductor device is not overly minimized, such that operational problems are not as significant of a concern as in prior art devices. Additionally, the topography of a buried word line allows for further processing to be performed over the vertical semiconductor device. Thus, more devices may be formed on a single semiconductor product. These and other features and advantages of the present invention will be presented in more detail in the following specification of the invention and the figures.

BRIEF DESCRIPTION OF THE DRAWINGS

The invention, together with further objects and advantages thereof, may best be understood by reference to the following description taken in conjunction with the accompanying drawings in which:

Referring to FIG. 1, semiconductor device 100 is typically comprised of several layers.

DETAILED DESCRIPTION OF THE PRESENT INVENTION

The invention relates to integrated circuits (ICs). Such ICs include memory ICs such as random access memories (RAMs), dynamic random access memories (DRAMs), synchronous DRAMs(SDRAMs), merged DRAM-logic circuits (embedded DRAMs), or other circuits.

Typically, numerous ICs are formed on the wafer in parallel. After processing is finish, the wafer is diced to separate the integrated circuits to individual chips. The chips are then packaged, resulting in a final product that is used in, for example, consumer products such as computer systems, cellular phones, personal digital assistants (PDAs), and other electronic products.

In accordance with one embodiment of the present invention, a vertical semiconductor device with a buried word line is disclosed. A vertical semiconductor device allows for miniaturization while avoiding the problems associated with overly small dimensions. At the same time, a buried word line allows for further processing of the wafer above the vertical semiconductor device. Further processing allows for more devices, particularly CMOS devices, to be included within a unit area.

Figure 4:
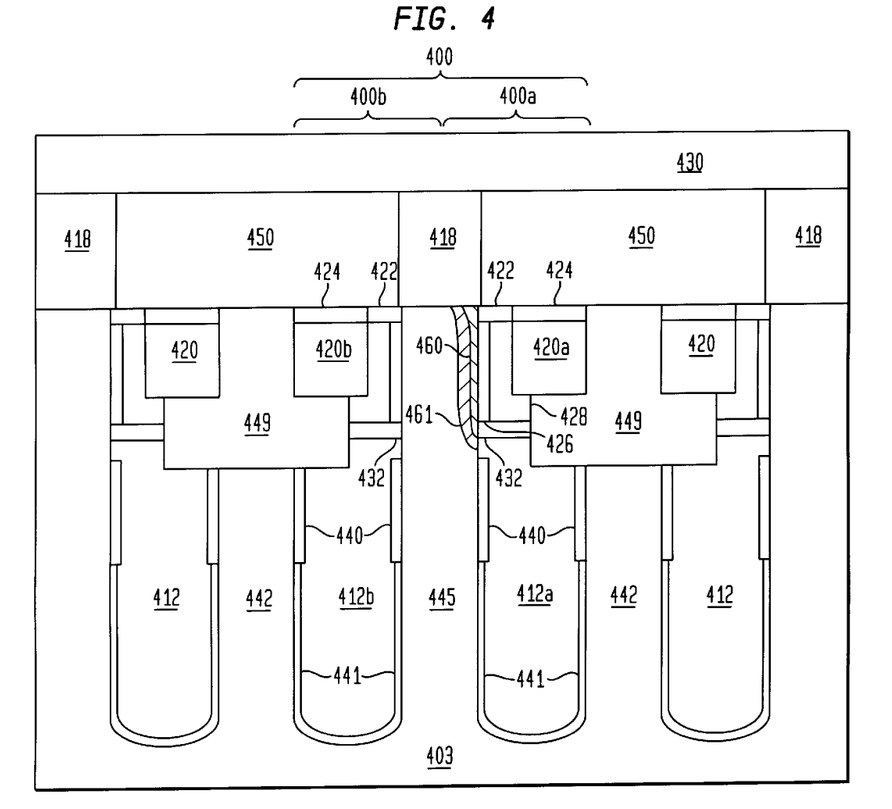
FIG. 4 is a cross-sectional view of a vertical semiconductor device with a buried word line in accordance with one embodiment of the present invention.

FIG. 4 is a cross-sectional view of a vertical semiconductor device with a buried word line in accordance with the present invention. FIG. 4 depicts a dual device 400 including semiconductor devices 400a and 400b. The illustrated embodiment depicts vertical transistors 400a and 400b having buried word lines 420a and 420b used in a memory configuration. However, a buried word line may be utilized with any suitable type of vertical semiconductor device. By way of example, diodes, fuses or any other type of semiconductor device that can be formed in a vertical manner and requiring a word or bit line may be utilized in accordance with the present invention.

Semiconductor devices 400a and 400b are formed on a substrate 403. While the illustrated embodiment depicts semiconductor devices 400a and 400b as dual semiconductor devices sharing a common bit line the present invention is not so limited. By way of example, the present invention further encompasses singular semiconductor devices independently coupled to a bit line or multiple semiconductor devices coupled to multiple bit lines in any given appropriate manner. The semiconductor devices are separated from other semiconductor devices by shallow trench isolation regions 449. Shallow trench isolation regions 449 prevent leakage currents from interacting between adjacent semiconductor devices.

Between semiconductor devices 400a and 400b is an active area 445. Active area 445 may be comprised of a substrate material, such as silicon or any other suitable semiconductor substrate material. Neighboring the active area 445 are deep trenches 412. Deep trenches 412 are used to store and release charge, typically in memory devices. Deep trenches 412 may be comprised of polysilicon or any other suitable conducting material.

On either side of deep trenches 412 are dielectric layers 440 and 441. Dielectric layers 440 may be composed of a thick dielectric material and dielectric layers 441 may be composed of a thin dielectric material. The dielectric layers prevent the leakage of charge from deep trenches 412. By way of example, dielectric layers 440 and 441 may be comprised of silicon dioxide, silicon nitride, combinations thereof or any other suitable material.

Above deep trench 412 and adjacent to shallow trench 449 is a barrier layer 432. Barrier layer 432 prevents leakage currents from forming in the active area unless the word lines have been energized. Barrier layer 432 may be composed, by way of example, of silicon dioxide, silicon nitride, combinations thereof or any other suitable insulative material.

Above barrier layer 432 are gate insulation layer 426 and gate layer 428. Gate insulation layer 426 insulates gate layer 428 from active area 445. Word line 420 is formed under the surface of substrate 403, which provides the desired planar characteristic of the surface of the substrate. Word line 420, in one embodiment, is formed through a process of etching, deposition and recessing, as described in further detail below. The recessing allows the word line to be buried beneath the surface of the substrate.

Gate layer 428 is in electrical contact with word line 420. Gate insulation layer 426, by way of example, may be composed of silicon dioxide, silicon nitride, combinations thereof or any other suitable insulative material. Gate layer 428, by way of example, may be composed of polysilicon, appropriately doped polysilicon or any other suitable semiconductive material.

On top of gate insulation layer 426 and gate layer 428 is a top insulation layer 422. Top insulation layer 422 provides insulation for the gate layer from any subsequent layers formed over the top insulation layer. Similarly, over word line 420 is a word insulation layer 424 that provides insulation for word line 420. By way of example, top insulation layer 422 and word insulation layer 424 may be comprised of silicon dioxide, silicon nitride, combinations thereof or any other suitable insulative material.

Directly over active area 445 is a bit line contact 418. Bit line contact 418 electrically couples the active area to a bit line 430. Between bit line contacts 418 are dielectric layers 450. Dielectric layers 450 provide insulation between individual bit line contacts 418 of adjacent bit line contacts 418 and the bit lines themselves.

When bit line 430 is properly biased with respect to substrate 403 and word line 420 a depletion region is formed between bit line contact 418 and deep trench 412. The illustrated embodiment depicts a depletion region 460 formed between bit line contact 418 and deep trench 412a. Energization of word line 420a creates an inversion region 461 between bit line contact 418 and deep trench 412a. Inversion region 461 allows a current to flow between bit line contact 418 and deep trench 412a. The direction of the current is dependent upon the bias of bit line 430 with respect to deep trench 412a.

By properly biasing bit line 430 and substrate 403 and energizing word line 420a allows a charge to be stored or released from deep trench 412a, which is well known in the art. Due to the verticalization of the transistor valuable surface area is preserved without the problems associated with over-miniaturization. Also, further processing steps can be performed over the vertical semiconductor devices because the word lines are buried. By burying the word lines the topographies of subsequent layers are not adversely affected.

Figure 5A:
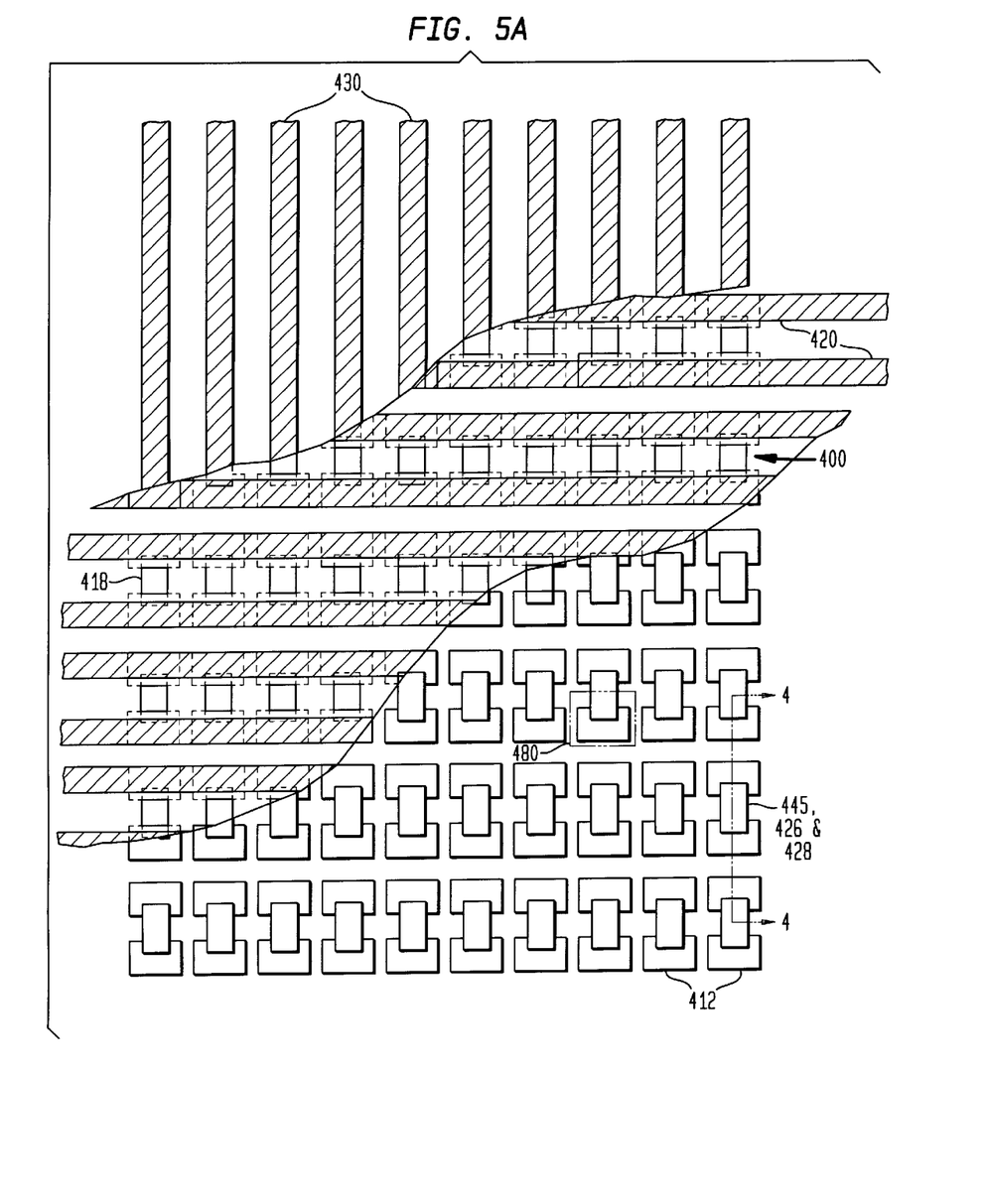
FIG. 5a is a layered top view of a semiconductor device in accordance with one embodiment of the present invention.

FIG. 5a is a layered top view of a semiconductor device in accordance with one embodiment of the present invention. The cross-section of individual semiconductor devices of FIG. 4 is taken along the lines 4—4. Deep trenches 412 are initially formed with active areas 445, gate layers 428 and gate oxide layers 426. Word lines 420 overlap the deep trenches and gate layers 428, and bit line contacts 418 are formed over the active areas, in addition to further processing, as discussed further below. And, bit lines 430 are formed over bit line contacts 418.

Figure 5B:
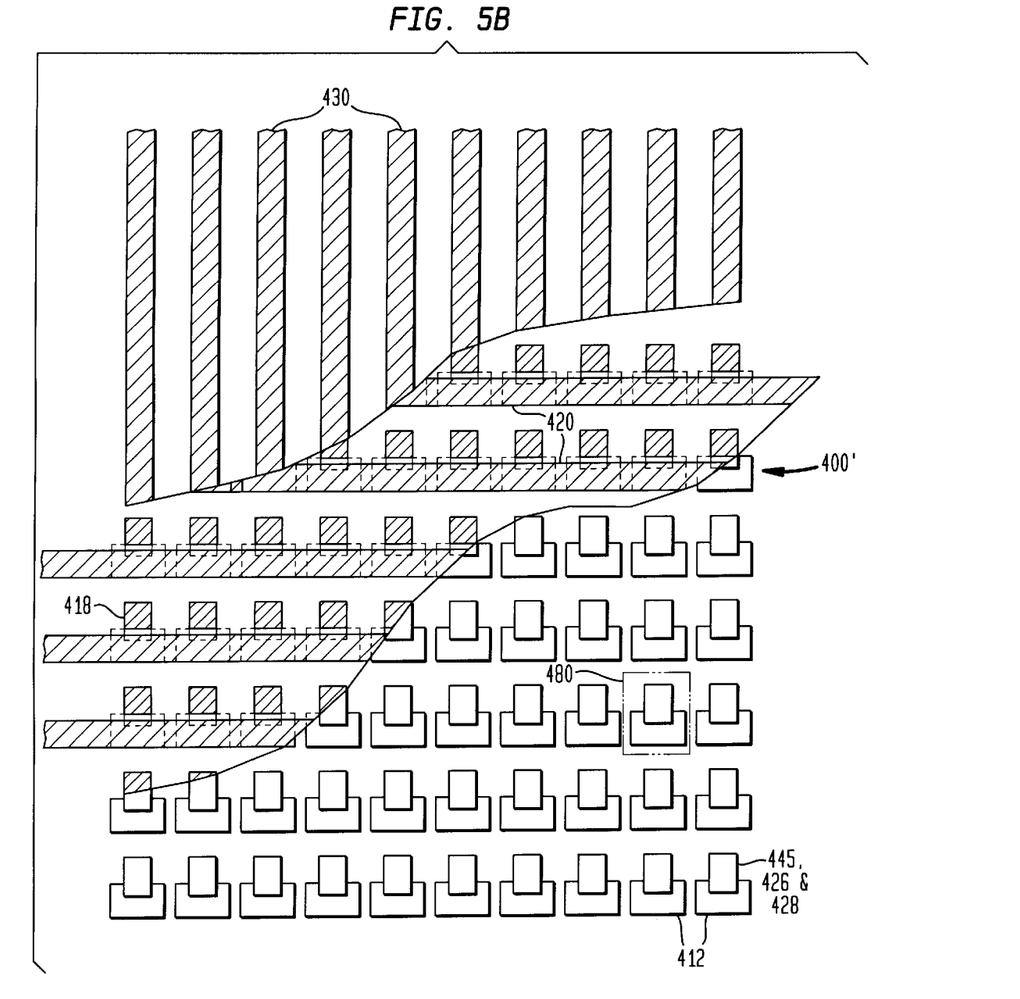
FIG. 5b is a layered top view of a semiconductor device in accordance with another embodiment of the present invention.

FIG. 5a depicts semiconductor devices 400a and 400b that share a common bit line contact 418. Again, the present invention is not limited to the dual device as depicted in FIG. 5a. By way of example, FIG. 5b is a layered top view of singular semiconductor devices in accordance with another embodiment of the present invention. FIG. 5b depicts individual semiconductor devices 400' that are coupled to individual bit line contacts 418. The overall vertical structure of semiconductor device 400' is similar to the illustrated dual device 400. Singular devices may provide even greater device area savings that dual devices. But, the present invention is also applicable to any number of semiconductor devices coupled to any number of common bit line contacts.

Device area 480 depicts the unit area necessary for one semiconductor device. Device area 480 is significantly smaller than the device areas of non-vertical semiconductor devices, and at the same time the semiconductor device 400 is not prone to short device length problems such as punch through or hot carriers. Also, the topography of the buried word lines 420 allow further processing to be performed over the semiconductor devices. Typically, prior art vertical transistor devices hampered attempts to form more circuitry over the vertical transistor devices due to the irregular formation of the word lines. Buried word lines allow verticalization while are preserving topographical integrity. These advantages allow for greater density and the potential to add further circuitry within a single product.

Vertical semiconductor device and a buried word line achieve smaller device areas than typical prior art devices. By way of example, a vertical semiconductor device with a buried word line, in alternate embodiments of the present invention, achieve device areas of $6F^2$ to $4F^2$ or even smaller. F is the device size, or the minimum dimension capable by a fabrication process. As device fabrication techniques improve the device areas are further decreased.

Figure 6:
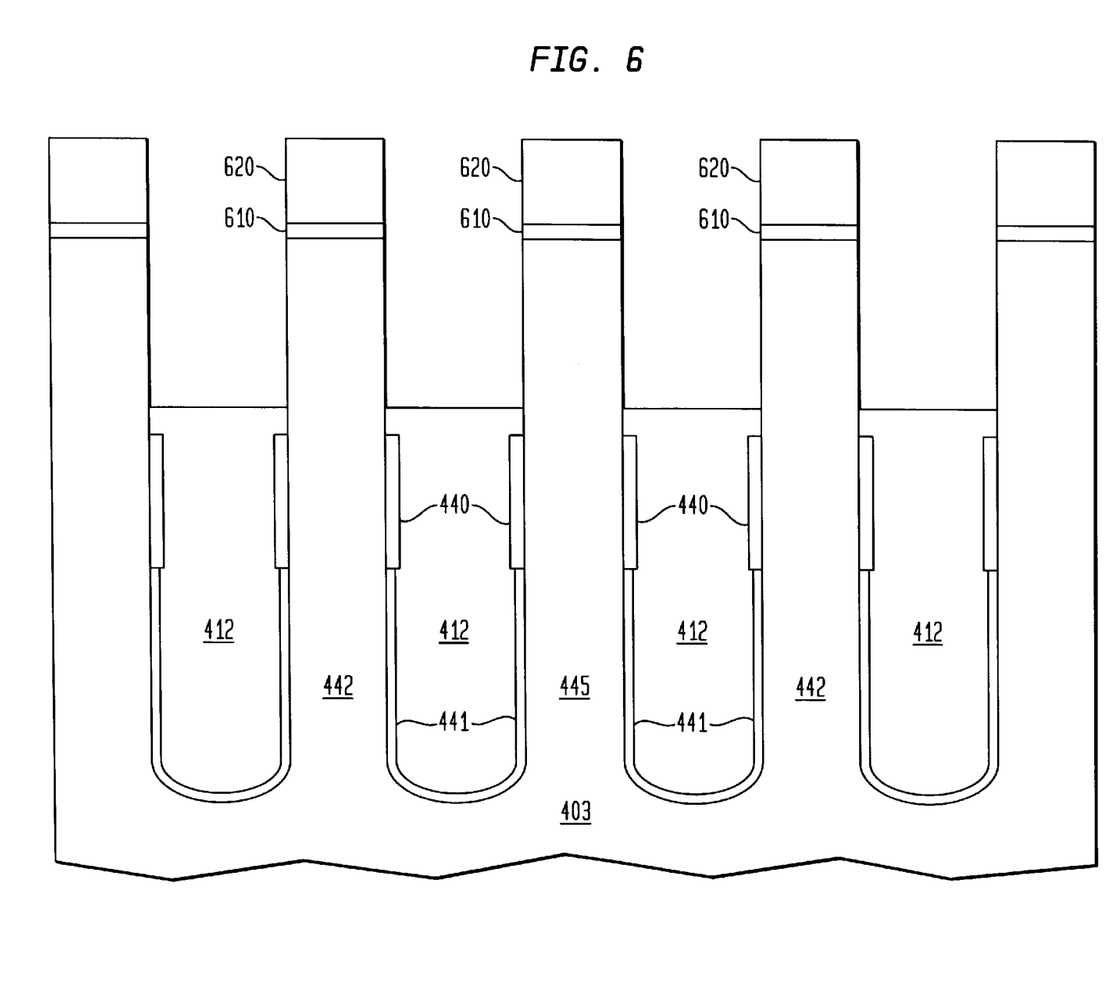
FIG. 6 is a cross-sectional view of a semiconductor device, in accordance with one embodiment of the present invention, at one stage of fabrication.

FIGS. 6 through 12 provide further details concerning the processing of a semiconductor device in accordance with the present invention. Referring to FIG. 6, a semiconductor device begins with a substrate 403. Substrate 403 is typically silicon. In accordance with the present invention, deep trenches 412 of polysilicon are formed on the substrate. The interspersed columns of substrate material form active areas 445 and silicon substrate areas 442. Dielectric layers 440 and 441 are also formed between deep trenches 412 and active areas 445 and silicon substrate areas 442.

By way of example, deep trenches may be formed by first applying an oxide layer 610 and a mask layer 620 over the areas reserved for active areas 445 and silicon substrate areas 445. By way of example, mask layer 620 may be formed from silicon nitride, silicon dioxide, combinations thereof or other suitable masking material. In one embodiment, the process of applying oxide layer 610 and mask layer 620, as well similar types of layers described herein, may be applied by masking and depositing as is known in the art. Additionally, etch stop layers may also be provided. Such etch stop layers may comprise nitride and is provided between, for example, the oxide and mask layers.

The columns for deep trenches 412 can then be evacuated through, for example, etching, reactive ion etching, electro-chemical etching or any other suitable method. Once the columns are excavated, the deep trench composition and dielectric layers 440 are formed within the trenches. Deep trenches 412 may be formed with polysilicon, doped polysilicon or any other suitable material. Dielectric layers 440 and 441 may be formed from any dielectric material. Good results have been found by utilizing a thick dielectric material for dielectric layers 440, which serve as the collar of the trench capacitor. By way of example, dielectric layers 440 may be formed from silicon dioxide, silicon nitride, combinations thereof or any other suitable insulative material. Dielectric layers 441 may be formed of a thin or thick dielectric material, for example, silicon dioxide, silicon nitride, combinations thereof or any other suitable insulative material.

Additionally, in another embodiment, deep trenches 412 may be formed by etching, depositing and recessing, which may also be applied to the formation of all the recessed areas formed in accordance with the present invention. Similarly, word line 420 may be formed by etching, depositing and recessing. An area is etched out by any suitable method of etching. The etched region may then be deposited with the appropriate material through conformal deposition. The material is typically deposited on all the exposed surfaces. The deposited material is removed from upper surfaces through planarization or etching, leaving the buried regions filled with the deposited material. Recess etching may be utilized to further remove the upper portions of the buried regions, in this case deep trench 412.

Methods of deposition may include, for example, chemical vapor deposition, plasma vapor deposition, sputtering or any other suitable deposition technique. Planarization and/or recessing may be accomplished by, for example, polishing, chemical mechanical polishing, etching, recess etching or any other suitable recessing technique. Recessing planarizes the filled area down below any masked areas. For example, deep trenches 412 are recessed below oxide layers 610 and mask layers 620. Recessing provides the ability of placing particular materials below a certain depth in the substrate. Mask layers, in alternate embodiments, may also be utilized in the deposition and recessing processes, as is known in the art.

Figure 7:
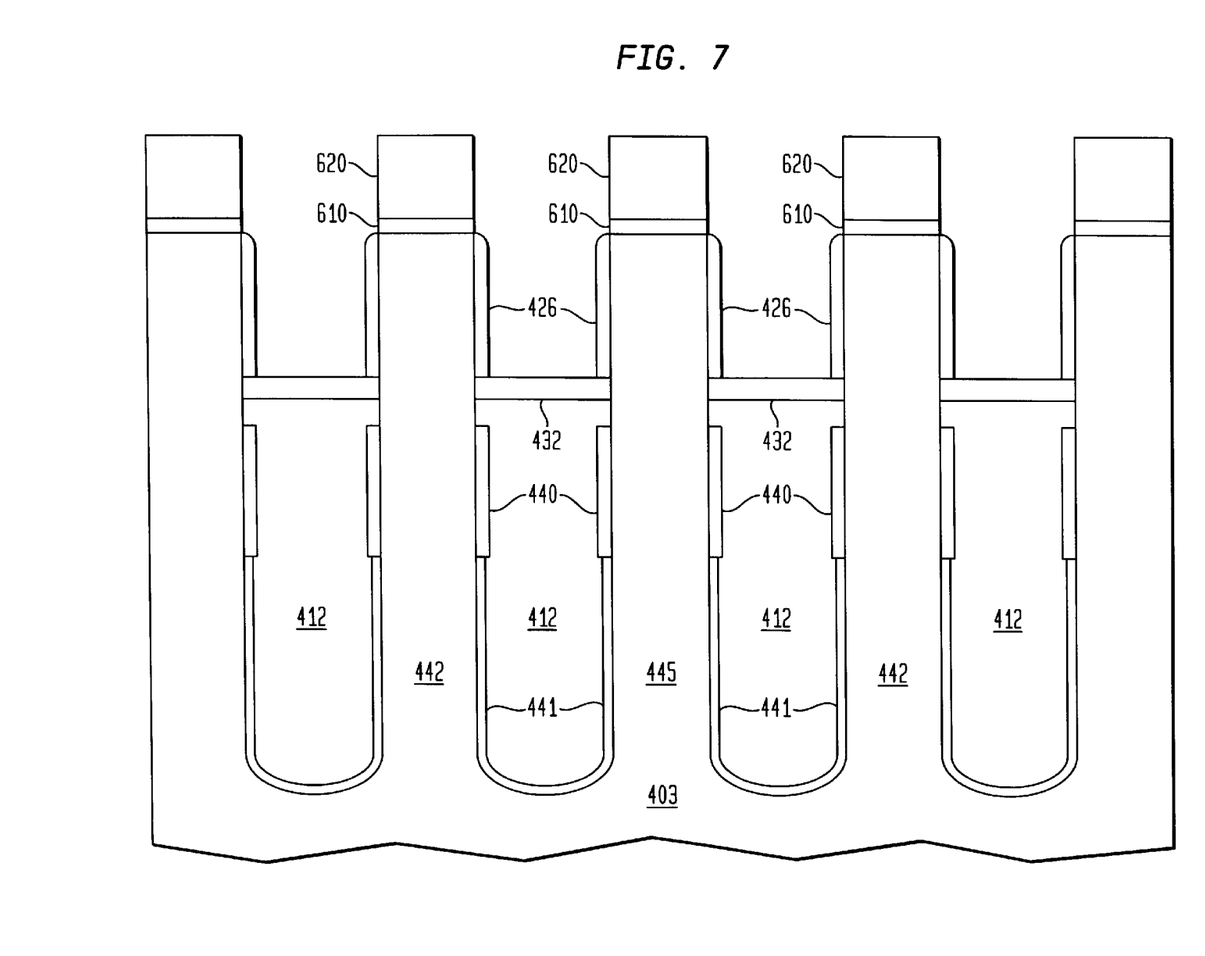
FIG. 7 is a cross-sectional view of the semiconductor device of FIG. 6, in accordance with one embodiment of the present invention, at a further stage of fabrication.

Referring now to FIG. 7, once deep trenches 412 and dielectric layers 440 are formed, barrier layers 432 are applied over deep trenches 412. Barrier layers 432, by way of example, may be comprised of silicon dioxide, silicon nitride, combinations thereof or any other suitable insulative material. Barrier layers 432 provide insulation between deep trenches 412 and a gate layer to be formed. The insulative properties of barrier layer 432 prevent leakage currents in the semiconductor device. Barrier layers 432 may be formed by etching, depositing and recessing, in one embodiment. Typically, the barrier layer is formed by CVD or other techniques such as high density PECVD.

Along the walls of active areas 445 and silicon substrate areas 442, and above barrier layers 432, gate insulation layers 426 are formed vertically. Gate insulation layers 426 serve as insulators for the gate that is formed in subsequent steps and active areas 445. Gate insulation layers 426 may be formed, by way of example, by a dry oxidation or thermal oxidation technique or any other suitable deposition technique. By way of further example, gate insulation layers 426 may be comprised of silicon dioxide, silicon nitride, combinations thereof or any other suitable insulative or dielectric material.

Figure 8:
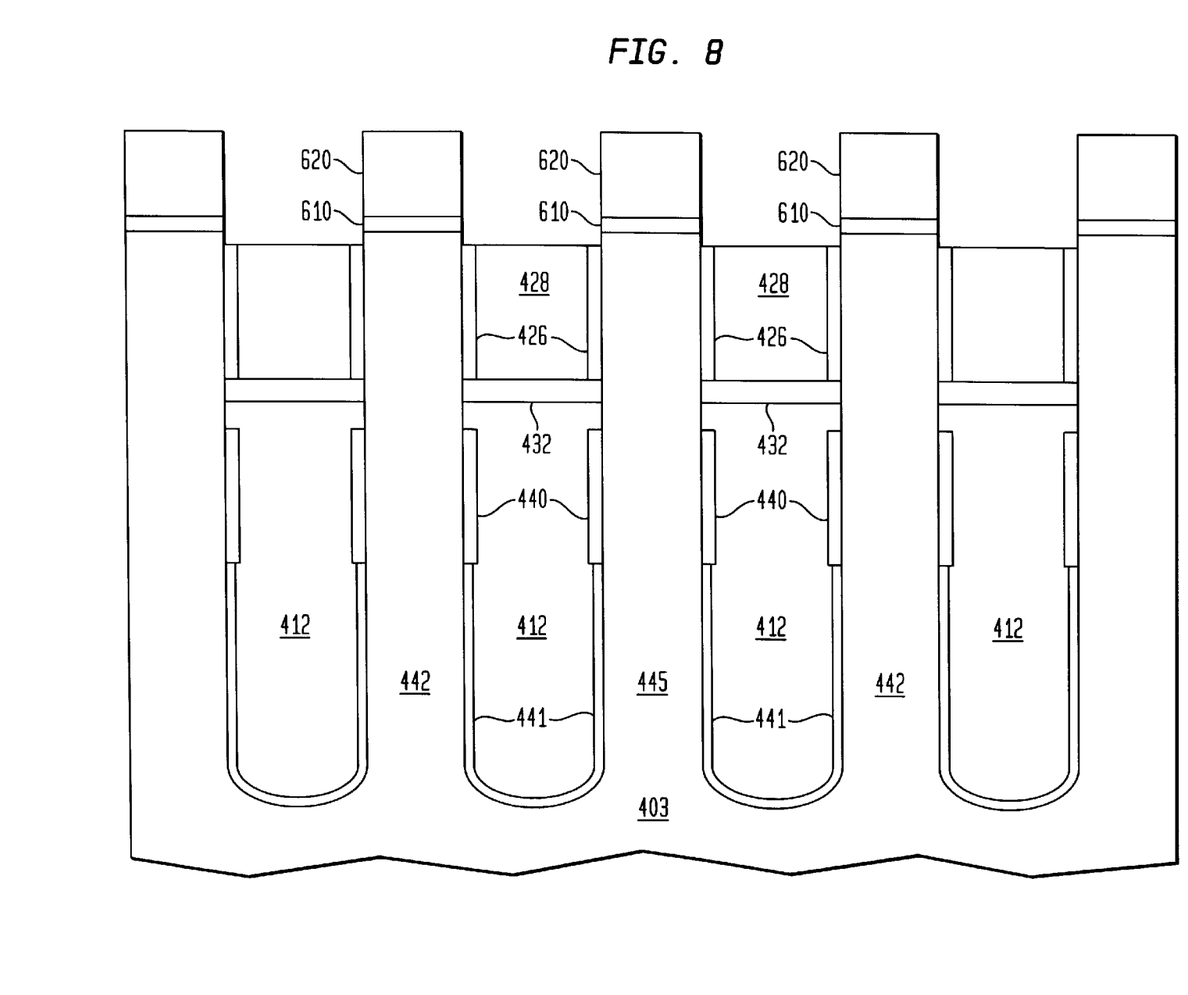
FIG. 8 is a cross-sectional view of the semiconductor device of FIG. 7, in accordance with one embodiment of the present invention, at a further stage of fabrication.

Referring now to FIG. 8, the regions between gate insulation layers 426 are filled with a gate layer 428. Gate layer 428, after further processing, will become the gate for the semiconductor devices. Gate layer 428, by way of example, may be comprised of polysilicon, doped polysilicon, or any other suitable materials. Once the regions in between gate insulation layers 426 are filled with gate layer material and gate layer 428 is recessed below oxide layer 610 to provide space for later deposited top layers (422 of FIG. 9). Alternatively, both gate insulation layer 426 and gate layer 428 may be recessed below oxide layer 610.

Figure 9:
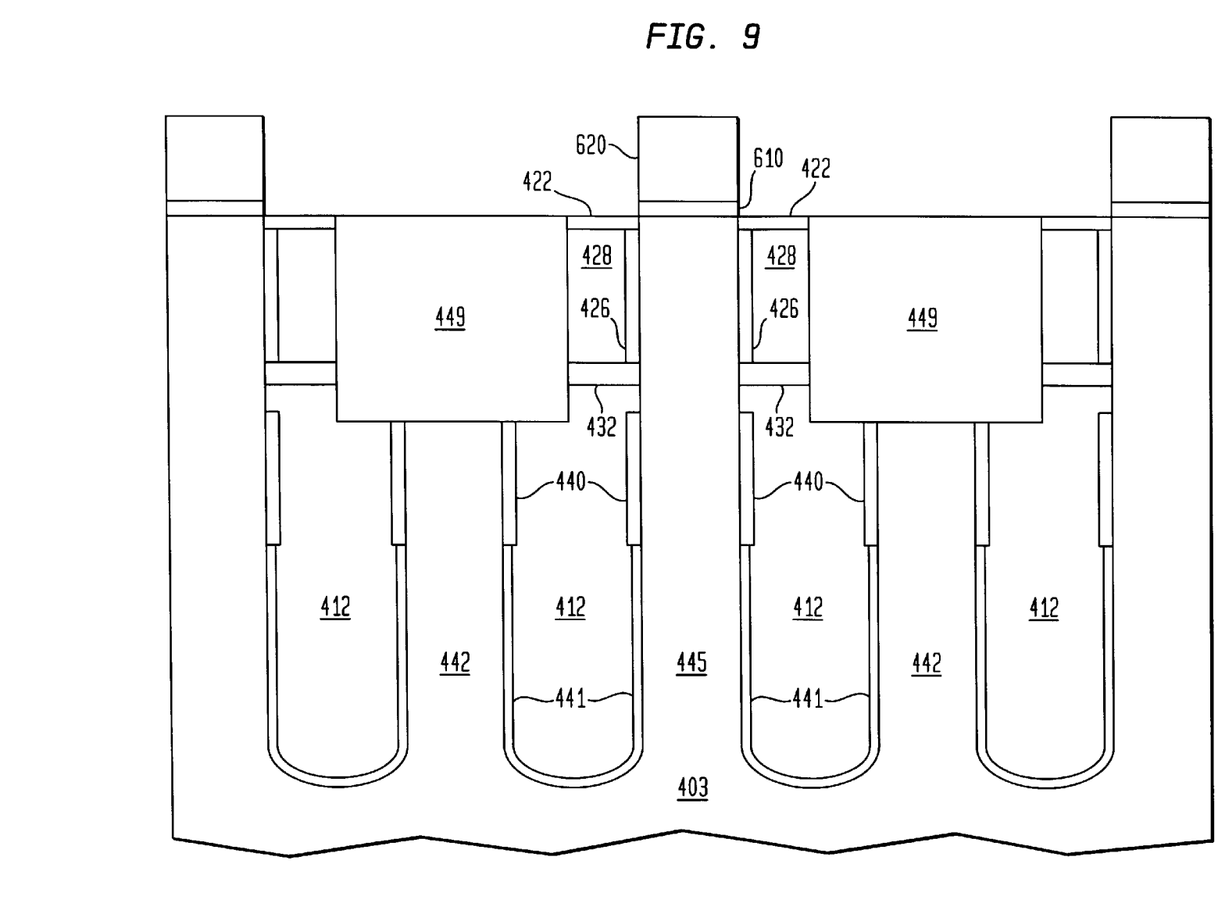
FIG. 9 is a cross-sectional view of the semiconductor device of FIG. 8, in accordance with one embodiment of the present invention, at a further stage of fabrication.

Referring to FIG. 9, shallow isolation trenches 449 and top layers 422 are formed with lithographic and etching techniques. The shallow isolation trench regions are masked and etched until dielectric layers 440 surrounding deep trenches 412 are reached. The voids 449 and 422 are then filled with material and planarized. Shallow trench isolation layers 449 act as insulation between separate semiconductor devices. Shallow trench isolation layers 449, by way of example, may be comprised of silicon dioxide, silicon nitride, combinations thereof or any suitable dielectric material. Top layers 422 may be formed of the same material as shallow isolation trenches 449.

Figure 10:
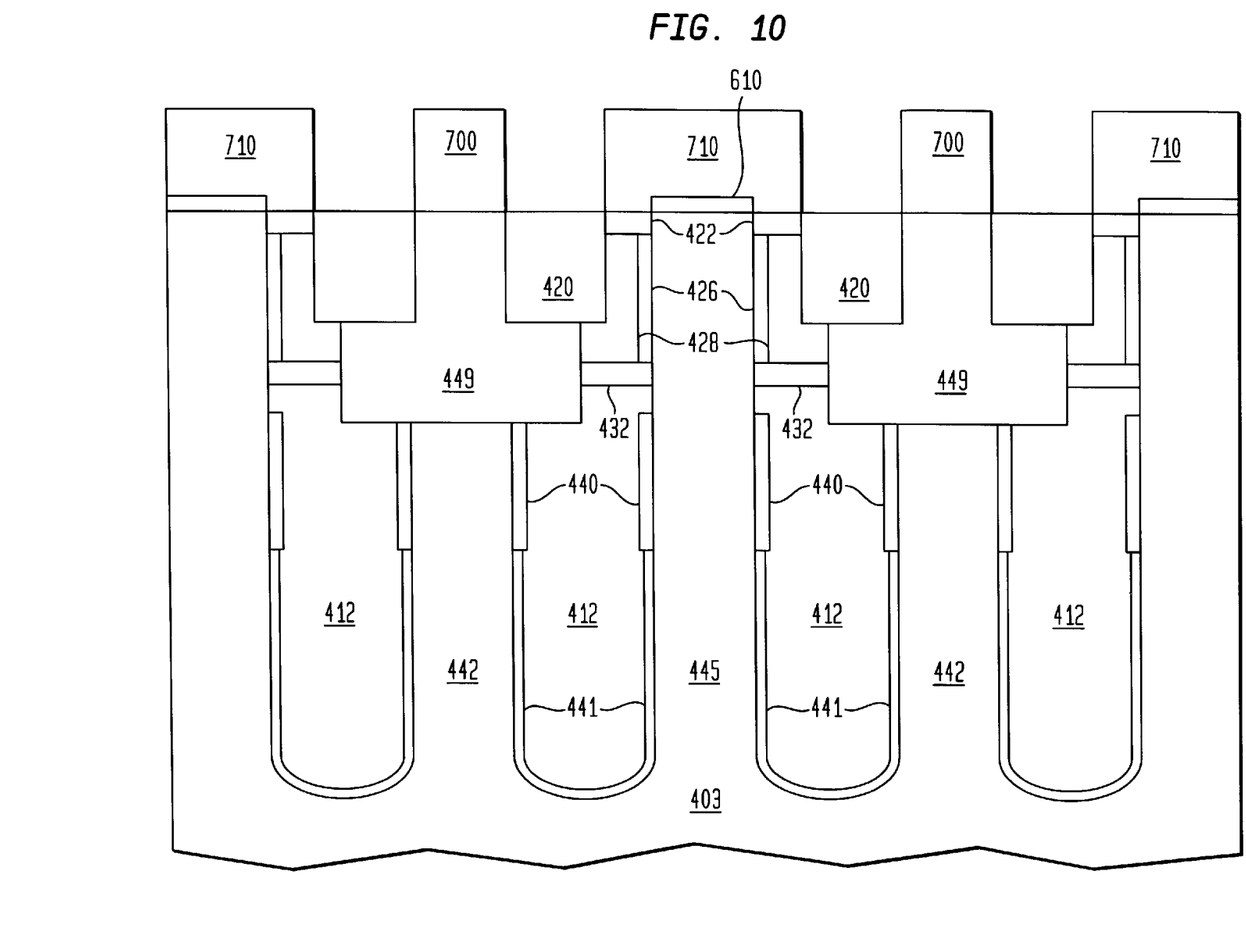
FIG. 10 is a cross-sectional view of the semiconductor device of FIG. 9, in accordance with one embodiment of the present invention, at a further stage of fabrication.

Referring now to FIG. 10, the remaining mask layers 620 are removed from oxide layers 610 which are located over active areas 445. New mask layers 710 and 700 are formed similar to mask layers 620, providing the mask for the following word line. Mask layer 710 is formed over oxide layers 610 and over top insulation layers 422. Mask layers 700 are formed over portions of shallow trench isolation layers 449. Mask layers 700 and 710 may be formed from the same materials and in the same processing step.

Once mask layers 700 and 710 have been appropriately placed and structured, the word line regions 420 are etched and filled with word line layers 420. Word line 420 lies adjacent to the area directly above silicon substrate area 442 and is formed partially into gate layer 428 such that gate layer 428 is substantially an L-shaped layer in the illustrated embodiment. Word line layers 420 may be formed from a single material, or different layers of material. By way of example, word line 420 can be formed from polysilicon, silizide, combinations of polysilicon and silizide, or any other suitable semiconductor material and combinations thereof It has been found that a dual layer construction consisting of polysilicon and silizide helps to reduce sheet resistance.

Word lines 420, in one embodiment, may be formed by etching, depositing and recessing, as described above. Recessing allows word lines 420 to be placed below oxide layers 610. Further, recessing allows for substantial planarization of the word line and subsequent layers formed over the word line.

The exemplary embodiment illustrates the planar nature of the buried word line. Word line 420 are embedded along side the active areas of a vertical semiconductor device. Typically, prior art devices located word lines on top of the vertical semiconductor devices. Thus, the topography of prior art devices were rendered non-planar due to the irregular shaping of the word lines.

The ability to planarize word lines 420 is another feature of the present invention. The location of word lines 420, in one embodiment, allows for planarization without damage to the semiconductor devices. Planarization of the word line in prior art devices was typically not possible due to the location of the word line, i.e., directly over the active areas of the prior art semiconductor devices.

Figure 11:
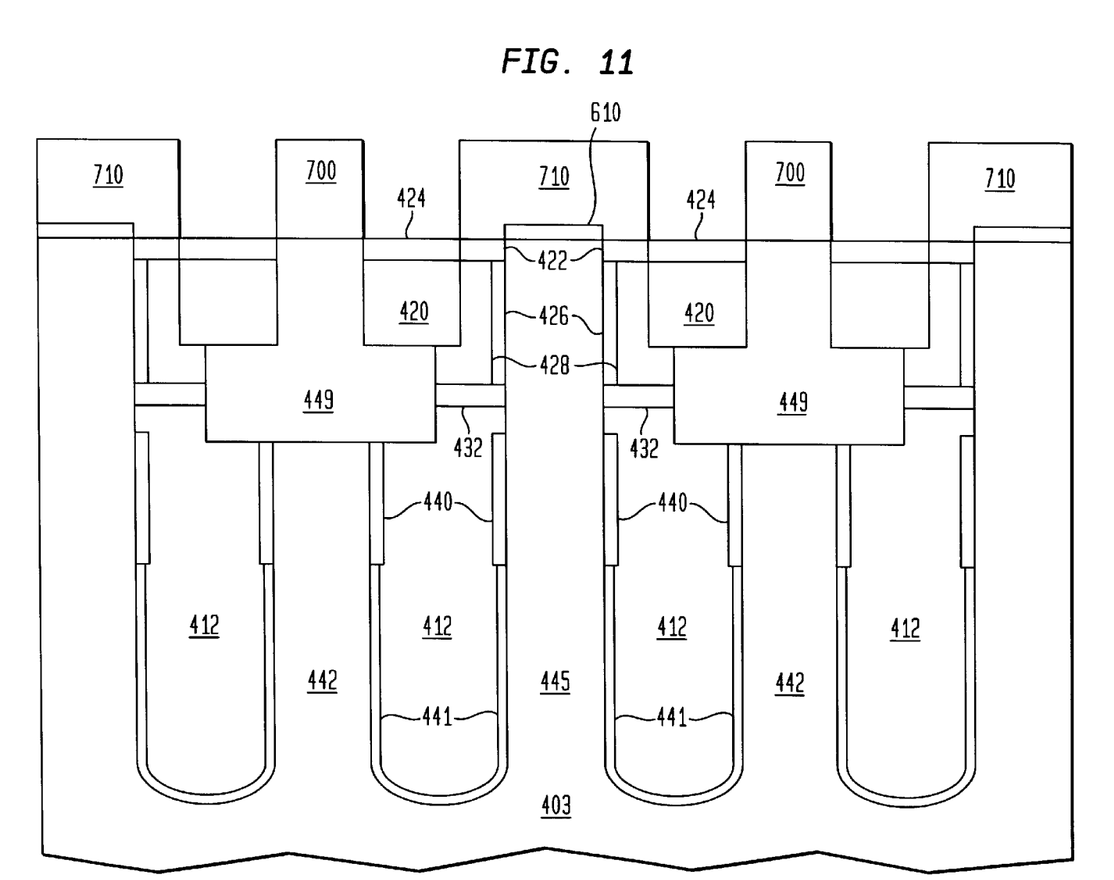
FIG. 11 is a cross-sectional view of the semiconductor device of FIG. 10, in accordance with one embodiment of the present invention, at a further stage of fabrication.

Referring now to FIG. 11, a top layer of word line layer 420 is further removed below the surface of the substrate, and below the level of oxide layer 610. The top layer is removed by, for example, through recessing, etching, or any other suitable technique. The top layer is removed to provide room for word line insulation layer 424. The removed top layer is then filled with word line insulation layer 424 and planarized down to oxide layer 610. Word line insulation layer 424 serves as insulation between word line 420 and subsequent layers placed over word line insulation layer 424. Word line insulation layer 424, by way of example, may be formed from silicon dioxide, silicon nitride, combinations thereof or any other suitable insulative or dielectric material.

Figure 12:
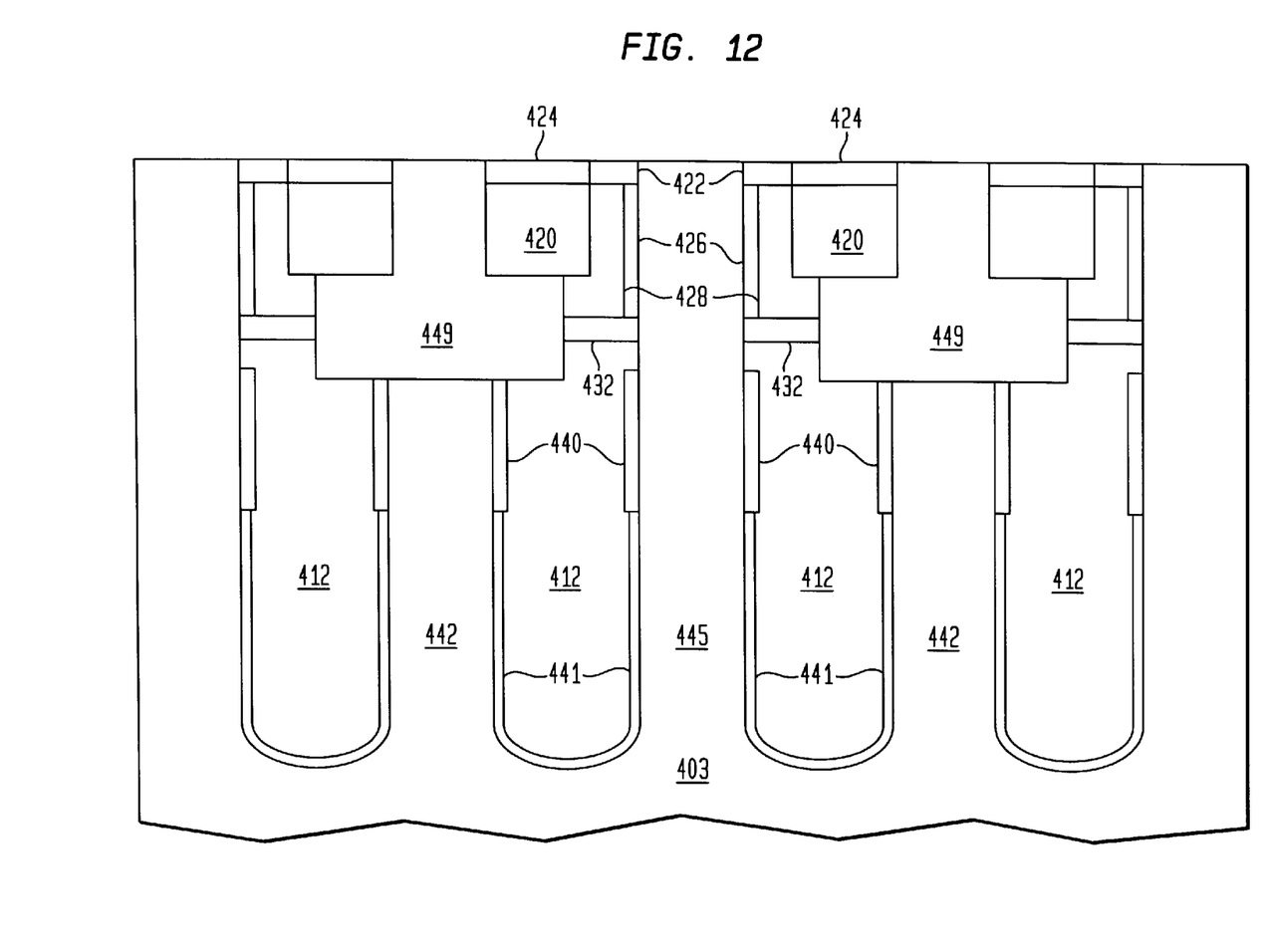
FIG. 12 is a cross-sectional view of the semiconductor device of FIG. 11, in accordance with one embodiment of the present invention, at a further stage of fabrication.

Referring now to FIG. 12, once word line insulation layers 424 have been formed, mask layers 700, 710 and oxide layer 610 may be removed and the entire surface may be planarized. The result, is a finished semiconductor device that need only be connected to a bit line having a substantially planar topography. Unlike prior art devices, the topography of the finished semiconductor device, in accordance with the present invention, can be further processed to add further layers of devices.

Referring back to FIG. 4, bit line contact 418, dielectric layers 450 and bit line 430 are easily added on top of the semiconductor devices. As can be appreciated, the topography above bit line 430 is substantially planar, more so than in prior art devices. Also, the elevation of the vertical semiconductor devices in accordance with the present invention may be formed at the same time as logic circuits formed on other regions of the substrate. Simultaneous formation of vertical semiconductor devices and logic circuitry also provides for substantially similar elevations, which allows for better connectivity and functionality. Further processing may also be performed above the semiconductor devices, by way of example, adding further CMOS devices or any other similar types of semiconductor devices. Thus, the present invention provides more versatile methods of forming vertical semiconductor devices that also allow the greater integration of vertical semiconductor devices and logic circuitry on a single semiconductor product.

Formation of the various regions and layers discussed may be accomplished by known techniques. For example, mask layers, and layers formed over the surface of substrate 403 may be formed by lithographic and etching techniques. However, any suitable techniques for forming such layers may be utilized in accordance with the present invention.

Layers, regions and trenches formed within the substrate may also be performed by any suitable technique, as known in the art. By way of example, etching, deposition and recessing have proven effective in forming the buried structures. Particularly, the formation of word lines 420, in one embodiment, may be formed by such a process.

Additionally, the methods of lithography, etching, deposition and recessing are not limited to those specifically described herein. All suitable techniques, as known in the art, may be utilized in accordance with the present invention. By way of example, deposition includes all methods of depositing or growing materials.

Thus, while the present invention has been described in terms of several illustrative embodiments, there are alterations, permutations, and equivalents which fall within the scope of the present invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A vertically oriented semiconductor device comprising:
   a semiconductor region including an upper surface;
   a vertically oriented transistor including a vertically oriented gate; and
   a word line disposed along side and electrically coupled to the vertically oriented gate, the word line distinct from the vertically oriented gate.

2. The semiconductor device of claim 1, wherein the word line is buried adjacent to the vertically oriented gate within the semiconductor device such that the topography of a subsequent layer deposited above the word line and the vertically oriented gate is substantially planar.

3. The semiconductor device of claim 1, wherein the semiconductor device is a vertically oriented dynamic random access memory cell device.

4. An array of semiconductor devices comprising:
   a semiconductor region including an upper surface;
   a pluralitv of vertically oriented transistors, each vertically oriented transistor including a vertically oriented gate;
   a word line disposed along side and coupled to the vertically oriented gate of at least two of the vertically oriented transistors, both the word line and the vertically oriented gate being substantially buried within the semiconductor device.

5. The semiconductor device of claim 4, wherein the word line is buried adjacent to the vertically oriented gate within the semiconductor device such that the topography of a subsequent layer deposited above the word line and the vertically oriented gate is substantially planar.

6. The array of semiconductor devices of claim 4, wherein the array of semiconductor devices is an array of dynamic random access memory cell devices.

7. A semiconductor product comprising:

a vertically oriented semiconductor device including a vertically oriented gate coupled to a word line, the word line disposed along side and physically abutting the vertically oriented gate, wherein the word line is buried within the semiconductor device such that the topography of a subsequent layer deposited above the word line and the vertically oriented gate is substantially planar.

8. The semiconductor product of claim 7, wherein the semiconductor product is a dynamic random access memory product.

9. A dynamic random access memory device comprising:

a semiconductor region including an upper surface;

a trench formed within the semiconductor region;

a capacitor, at least a portion of the capacitor disposed within the trench;

a vertical transistor disposed between the capacitor and the upper surface of the semiconductor region, the vertical transistor including a vertically oriented gate; and a wordline disposed along side the vertically oriented gate and electrically coupled to the vertically oriented gate.

10. The device of claim 9 wherein the wordline is entirely disposed beneath the upper surface of the semiconductor device.

11. The device of claim 10 and further comprising a wordline insulation layer formed over the wordline, the wordline insulation layer having an upper surface that is substantially planar with the upper surface of the semiconductor region.

12. The device of claim 9 wherein the wordline comprises a dual layer including a polysilicon layer and a silicide layer.

13. The device of claim 12 wherein the vertically oriented gate comprises a polysilicon gate.

14. The device of claim 9 wherein the wordline physically abuts the vertically oriented gate.

15. The device of claim 9 and further comprising a bitline contact coupled to the upper surface of the semiconductor region.

* * * * *